(12) United States Patent
Cox et al.

(10) Patent No.: US 6,671,850 B1
(45) Date of Patent: Dec. 30, 2003

(54) ON-THE-FLY ALGEBRAIC ERROR CORRECTION SYSTEM AND METHOD FOR REDUCING ERROR LOCATION SEARCH

(75) Inventors: Charles Edwin Cox, San Jose, CA (US); Martin Aureliano Hassner, Mountain View, CA (US); Barry Marshall Trager, Yorktown Heights, NY (US); Shmuel Winograd, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/562,575

(22) Filed: May 1, 2000

(51) Int. Cl.[7] .................. H03M 13/00; G11B 5/09; G06F 7/00
(52) U.S. Cl. .................. 714/781; 714/764; 360/48; 708/492
(58) Field of Search .................. 714/781, 784, 714/786, 764; 360/48, 49, 53; 708/492

(56) References Cited

U.S. PATENT DOCUMENTS

| | | | | |
|---|---|---|---|---|
| 4,504,948 A | | 3/1985 | Patel | 371/38 |
| 4,875,211 A | | 10/1989 | Murai et al. | 371/40.1 |
| 5,001,715 A | | 3/1991 | Weng | 371/37.1 |
| 5,377,207 A | | 12/1994 | Perlman | 371/37.1 |
| 5,535,140 A | | 7/1996 | Iwamura | 364/550 |
| 5,710,782 A | | 1/1998 | Weng | 371/37.1 |
| 5,737,343 A | | 4/1998 | Meyer | 371/37.1 |
| 5,768,296 A | | 6/1998 | Langer et al. | 371/37.11 |
| 5,771,246 A | | 6/1998 | Weng | 371/39.1 |
| 5,805,617 A | | 9/1998 | Im | 371/37.12 |
| 5,818,854 A | | 10/1998 | Meyer | 371/37.1 |
| 5,905,740 A | * | 5/1999 | Williamson | 714/784 |
| 5,942,005 A | | 8/1999 | Hassner | 714/784 |
| 5,943,348 A | * | 8/1999 | Ly | 714/761 |
| 5,946,328 A | | 8/1999 | Cox et al. | 371/37.11 |
| 6,092,233 A | * | 7/2000 | Yang | 714/784 |
| 6,122,766 A | * | 9/2000 | Fukuoka et al. | 714/784 |
| 6,154,868 A | * | 11/2000 | Cox et al. | 714/784 |
| 6,192,497 B1 | * | 2/2001 | Yang et al. | 714/781 |
| 6,199,188 B1 | * | 3/2001 | Shen et al. | 714/782 |
| 6,345,376 B1 | * | 2/2002 | Cox et al. | 714/785 |
| 6,374,383 B1 | * | 4/2002 | Weng | 714/781 |

OTHER PUBLICATIONS

"Implementation of Reed Solomon Codes over Symbols of Size 16 Bits—Method and Apparatus," IBM Technical Disclosure Bulletin, vol. 37, No. 02A, Feb. 1994.

(List continued on next page.)

Primary Examiner—Stephen M. Baker
Assistant Examiner—Anthony T. Whittington
(74) Attorney, Agent, or Firm—Samuel A. Kassatly

(57) ABSTRACT

An on-the-fly algebraic error correction system and corresponding method for reducing error location search are presented. The method transforms an error locator polynomial into two transformed polynomials whose roots are elements in a smaller subfield, in order to significantly simplify the complexity, and to reduce the latency of the error correcting system hardware implementation. More specifically, if the error locator polynomial is over a finite field of ($2^{2n}$) elements, the transformed polynomial is over a finite subfield of ($2^n$) elements. Thus, the problem of locating the roots of the error locator polynomial is reduced to locating the roots of the transformed polynomials. Assuming the error locator polynomial is of degree m, the present method requires at most ($m^2/2$) evaluations of polynomials over the Galois field $GF(2^{2n})$ and ($2^{n+1}$) evaluations over the subfield $GF(2^n)$ or root finding of two polynomials of at most a degree m over the subfield $GF(2^n)$.

22 Claims, 8 Drawing Sheets

OTHER PUBLICATIONS

"Fast Double Error Correction," IBM Technical Disclosure Bulletin, vol. 25, No. 5, Oct. 1982.

D.S. Dummit, "Solving Solvable Quintics," Mathematics of Computation, vol. 57, No. 195, Jul. 1991, pp. 387–401.

"Logic and Software Engineering," International Workshop in Honor of Chih–Sung Tang, Aug. 14–15, 1995.

"Convenient Roots for a Reed Solomon Code," IBM Technical Disclosure Bulletin, vol. 27, No. 2, Jul. 1984.

Carl Bender et al., "Quasi–Exactly Solvable Quartic Potential," Journal of Physics A Mathematical and General, vol. 31, No. 14, Apr. 10, 1998.

* cited by examiner

US 6,671,850 B1

ON-THE-FLY ALGEBRAIC ERROR CORRECTION SYSTEM AND METHOD FOR REDUCING ERROR LOCATION SEARCH

FIELD OF THE INVENTION

The present invention relates to the field of data storage, and particularly to error correcting systems and methods employing on-the-fly algebraic error correcting codes. More specifically, this invention relates to an improved method for transforming an error locator polynomial into two polynomials whose roots are elements in a smaller subfield, in order to significantly simplify the complexity of the error location calculation implementation.

BACKGROUND OF THE INVENTION

The use of cyclic error correcting codes in connection with the storage of data in storage devices is well established and is generally recognized as a reliability requirement for the storage system. Generally, the error correcting process involves the processing of syndrome bytes to determine the location and value of each error. Non-zero syndrome bytes result from the exclusive-ORing of error characters that are generated when data is written on the storage medium.

The number of ECC check characters employed depends on the desired power of the code. As an example, in many present day ECC systems used in connection with the storage of 8-bit bytes in a storage device, two check bytes are used for each error to be corrected in a codeword having a length of at most 255 byte positions. Thus, for example, six check bytes are required to correct up to three errors in a block of data having 249 data bytes and six check bytes. Six distinctive syndrome bytes are therefore generated in such a system. If there are no errors in the data word comprising the 255 bytes read from storage, then the six syndrome bytes contain an all zero pattern. Under such a condition, no syndrome processing is required and the data word may be sent to the central processing unit. However, if one or more of the syndrome bytes are non-zero, then syndrome processing involves the process of identifying the location of the bytes in error and further identifying the error pattern for each error location.

The underlying mathematical concepts and operations involved in normal syndrome processing operations have been described in various publications. These operations and mathematical explanations generally involve first identifying the location of the errors by use of what has been referred to as the "error locator polynomial". The overall objective of the mathematics involved employing the error locator polynomial is to define the locations of the bytes in error by using only the syndrome bytes that are generated in the system.

The error locator polynomial has been conventionally employed as the start of the mathematical analysis to express error locations in terms of syndromes, so that binary logic may be employed to decode the syndrome bytes into first identifying the locations in error, in order to enable the associated hardware to identify the error patterns in each location.

Moreover, error locations in an on-the-fly ECC used in storage or communication systems are calculated as roots of the error locator polynomial. The calculation of the roots represents a bottleneck in the implementation of the on-the-fly ECC. In certain designs, the roots calculation is done by explicit formulas whose hardware implementation becomes increasingly complex as the number of correctable errors increases.

In other designs, the roots calculation is done by an iterative search over all possible data symbol locations. The latency of these designs can be excessive, which requires several searches to be conducted in parallel over disjoint phases of symbol locations, and to be implemented in the arithmetic of the finite field that covers the complete data set.

Thus, there is still an unsatisfied need for a method that reduces the problem of searching over a large sector to searches over a smaller finite subfield for reducing the complexity and resulting latency of the hardware implementation.

SUMMARY OF THE INVENTION

In accordance with the present invention, a method is provided to transform an error locator polynomial into two new polynomials whose roots are elements in a smaller subfield, in order to significantly simplify the complexity, and to reduce the latency of the error correcting system hardware implementation.

The above and other features of the present invention are realized by an on-the-fly algebraic error correction system and corresponding method for reducing error location search. The method transforms an error locator polynomial into two transformed polynomials whose roots are elements in a smaller subfield, in order to significantly simplify the complexity, and to reduce the latency of the error correcting system hardware implementation.

More specifically, if the error locator polynomial is over a finite field of ($2^{2n}$) elements, the transformed polynomials are over a finite subfield of ($2^n$) elements. Thus, the problem of locating the roots of the error locator polynomial is reduced to locating the roots of the transformed polynomials. Assuming the error locator polynomial is of degree m, the present method requires at most ($m^2/2$) evaluations of polynomials over the Galois field $GF(2^{2n})$, along with root finding of two polynomials of degree m over the Galois subfield $GF(2^n)$.

BRIEF DESCRIPTION OF THE DRAWINGS

The various features of the present invention and the manner of attaining them will be described in greater detail with reference to the following description, claims, and drawings, wherein reference numerals are reused, where appropriate, to indicate a correspondence between the referenced items, and wherein:

DETAILED DESCRIPTION OF THE INVENTION

Figure 1:
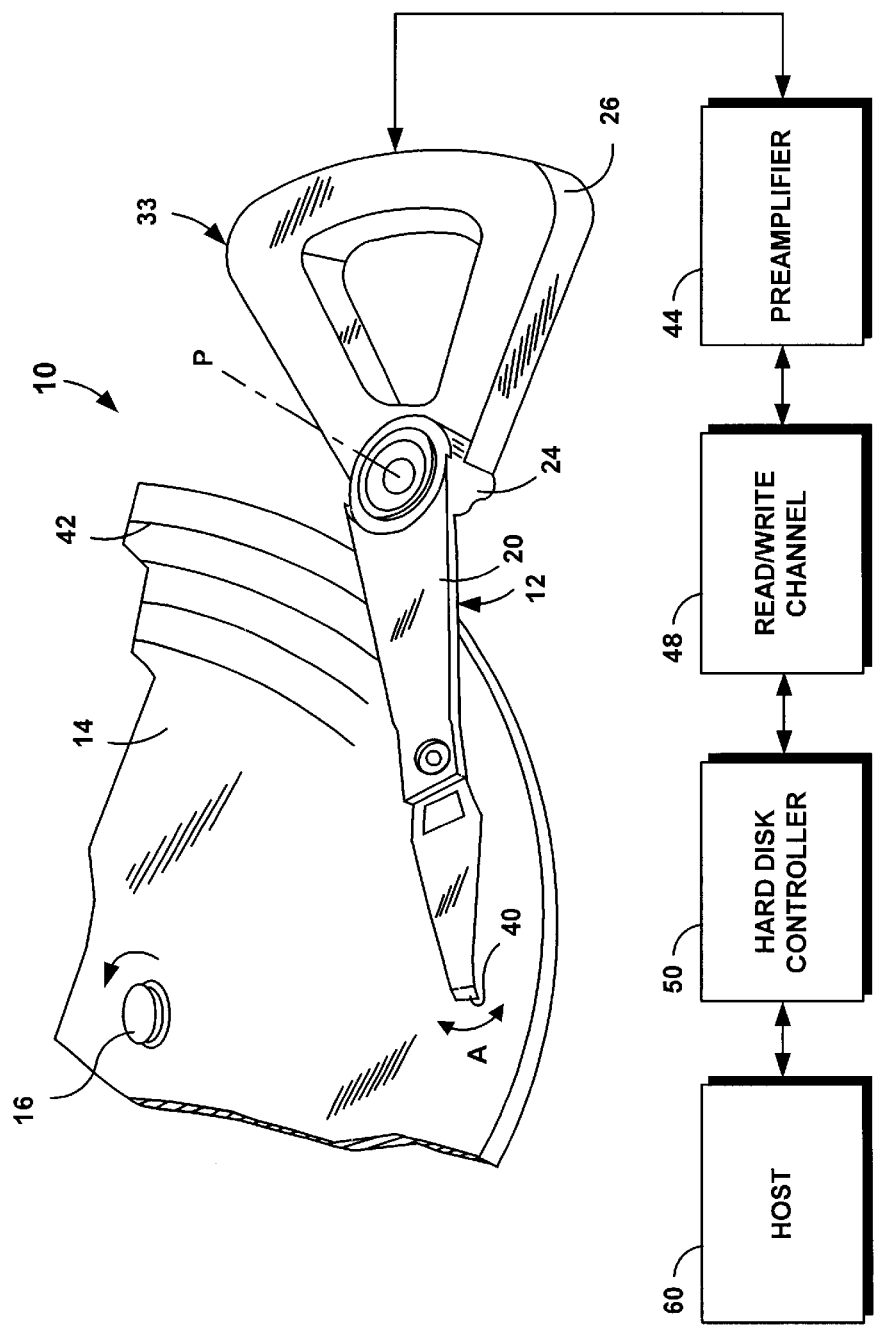
FIG. 1 is a schematic illustration of a data storage system such as a disk drive that implements an on-the-fly algebraic error correction code (ECC) according to the present invention.

FIG. 1 illustrates a disk drive 10 comprised of a head stack assembly 12 and a stack of spaced apart magnetic, optical and/or MO data storage disks or media 14 that are rotatable about a common shaft 16. The head stack assembly 12 includes a number of actuator arms 20 that extend into spacings between the disks 14, with only one disk 14 and one actuator arm 20 being illustrated for simplicity of illustration. The disk drive 10 further includes a preamplifier 44, a read/write channel 48, and a hard disk controller 50.

The head stack assembly 12 also includes an E-shaped block 24 and a magnetic rotor 26 attached to the block 24 in a position diametrically opposite to the actuator arms 20. The rotor 26 cooperates with a stator (not shown) for the actuator arms 20 to rotate in a substantially radial direction, along an arcuate path in the direction of an arrow A. Energizing a coil of the rotor 26 with a direct current in one polarity or the reverse polarity causes the head stack assembly 12, including the actuator arms 20, to rotate around axis P in a direction substantially radial to the disks 14. A head disk assembly 33 is comprised of the disks 14 and the head stack assemblies 12.

A transducer head 40 is mounted on the free end of each actuator arm 20 for pivotal movement around axis P. The magnetic rotor 26 controls the movement of the head 40 in a radial direction, in order to position the head 40 in registration with data information tracks or data cylinders 42 to be followed, and to access particular data sectors on these tracks 42.

Numerous tracks 42, each at a specific radial location, are arrayed in a concentric pattern in a magnetic medium of each surface of data disks 14. A data cylinder includes a set of corresponding data information tracks 42 for the data surfaces of the stacked disks 14. Data information tracks 42 include a plurality of segments or data sectors, each containing a predefined size of individual groups of data records that are saved for later retrieval and updates. The data information tracks 42 can be disposed at predetermined positions relative to a servo reference index.

Figure 2:
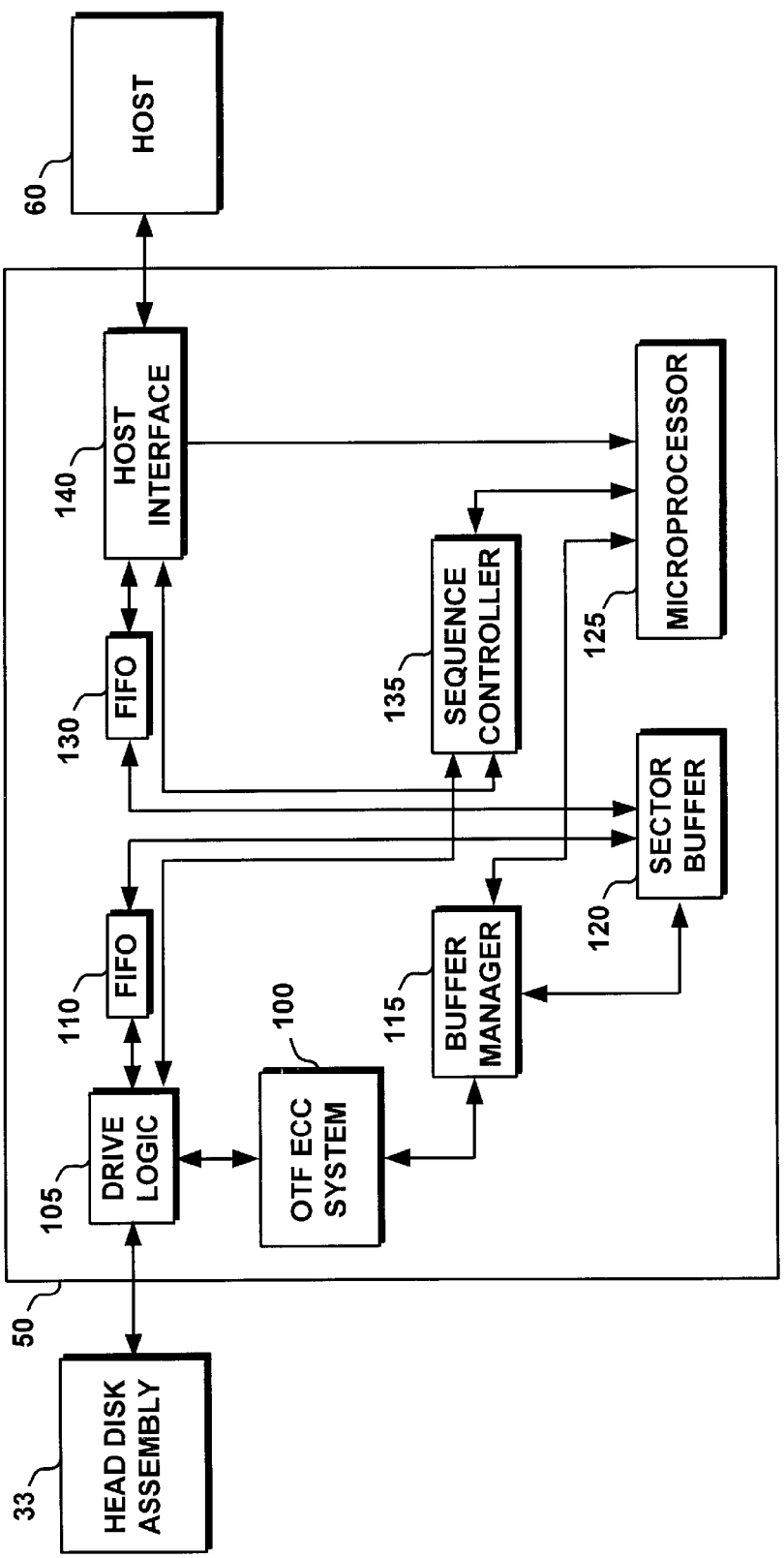
FIG. 2 is a block diagram detailing the architecture of a buffered hard disk controller that includes an on-the-fly (OTF) error correction code (ECC) system for implementing the on-the-fly error correction code according to the present invention.

FIG. 2 illustrates an exemplary architecture of a buffered hard disk controller 50 that comprises an on-the-fly (OTF) error correction code (ECC) system 100 for implementing the on-the-fly error correction code according to the present invention. It should be clear that the present invention is not limited to this specific architecture and that it can be implemented by, or in conjunction with other architectures.

The hard drive controller 50 includes a logic drive circuit 105 that formats data from the hard disk assembly 33, for example from 8 bits to 32 bits. A FIFO register 110 stores the formatted data and exchanges the same with a sector buffer 120. The ECC system 100 receives the formatted data from the drive logic circuit 105 and performs the error correction coding algorithm of the present invention, as described herein.

A buffer manager 115 controls data traffic between the ECC system 100, a sector buffer (i.e., random access memory) 120, and a microprocessor 125. Another FIFO register 130 stores data and exchanges the same with the sector buffer 120. A sequence controller 135 is connected between the drive logic circuit 105, the microprocessor 125, and a host interface 140, to control the sequence operation of the data traffic and various commands across the hard drive controller 50. The host interface 140 provides an interface between the hard drive controller 50 and a host 60.

Figure 3:
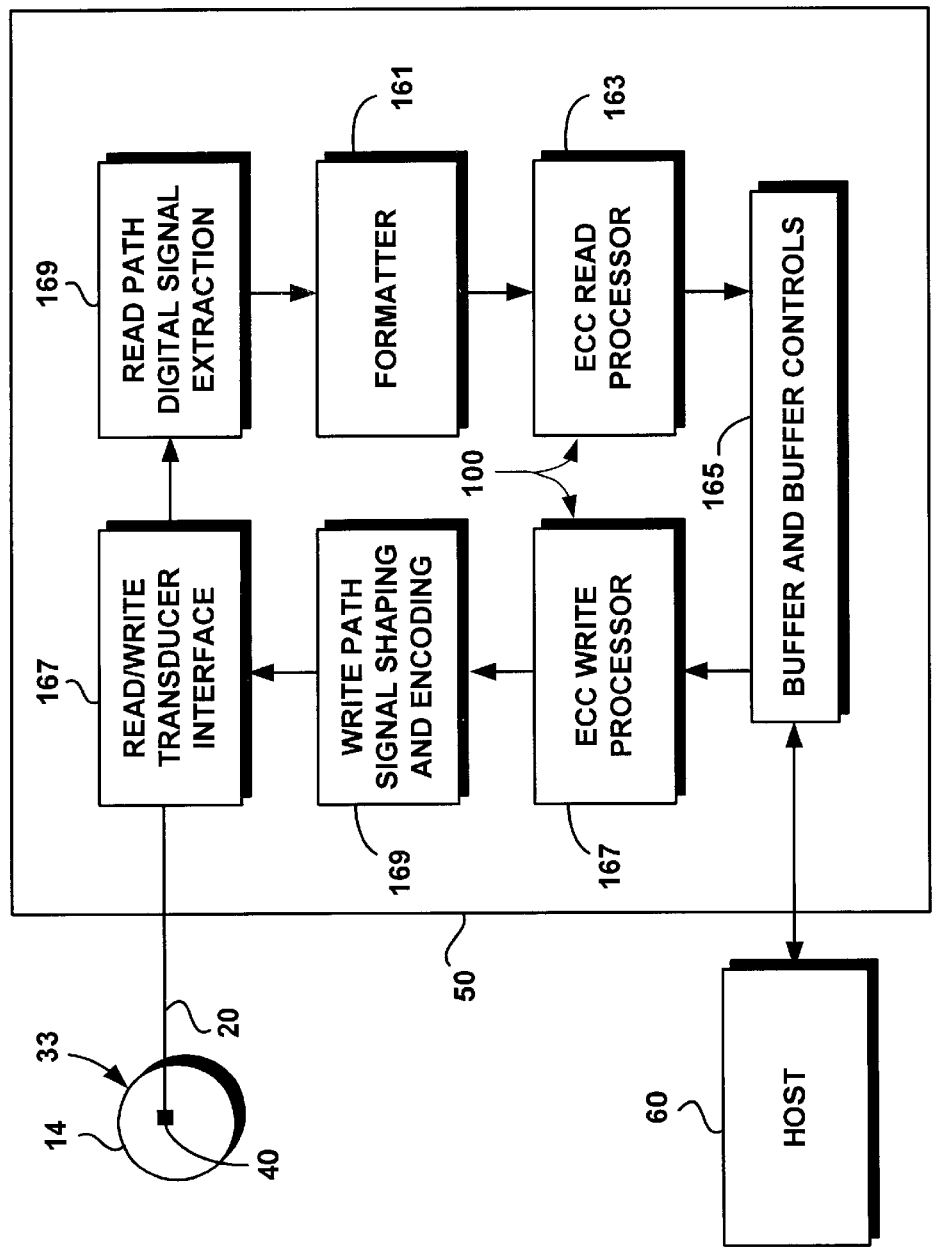
FIG. 3 is a block diagram of the data storage system of FIG. 1, depicting data flow along a read channel and a write channel of the hard drive controller of FIG. 2, and illustrating an exemplary on-the-fly error correction code system comprised of an ECC read processor and an ECC write processor.

FIG. 3 is a block diagram of the hard disk controller 50 of FIG. 2 that includes an on-the-fly error correction code system 100 comprised of an ECC read processor 163 and an ECC write processor 167. When sequences of digital binary data are to be written onto the disk 14, they are placed temporarily in a buffer 165 and subsequently processed and transduced along a write path or channel (157, 167, and 169).

First, a predetermined number of binary data elements, also termed bytes, in a data string are moved from the buffer 165 and streamed through an ECC write processor 167. In the ECC write processor 167, the data bytes are mapped into codewords drawn from a suitable linear block or cyclic code such as a Reed-Solomon code. Next, each codeword is mapped in a write path signal-shaping unit 169 into a run length limited or other bandpass or spectral-shaping code and changed into a time-varying signal. The write path signal-shaping unit 169 includes an encoder 202 (FIG. 4) for encoding the signals as described herein. The time-varying signal is applied through an interface read/write transducer interface 157 and thence to the write element in a magnetoresistive or other suitable transducer head 40 for conversion into magnetic flux patterns.

All of the measures starting from the movement of the binary data elements from buffer 165 until the magnetic flux patterns are written on a selected disk track 42 (FIG. 1) as the rotating disk 14 passes under the head 40 are synchronous and streamed. For purposes of efficient data transfer, the data is destaged (written out) or staged (read) a disk sector at a time. Thus, both the mapping of binary data into Reed-Solomon codewords and the conversion to flux producing time-varying signals must be done well within the time interval defining a unit of recording track length moving under the transducer. Typical units of recording track length are equal fixed-length byte sectors of 512 bytes.

When sequences of magnetic flux patterns are to be read from the disk 14, they are processed in a read path or channel (157, 159, 161, and 163) and written into the buffer 165. The time-varying signals sensed by transducer 40 are passed through the read/write transducer interface 157 to a digital signal extraction unit 159. Here, the signal is detected and a decision is made as to whether it should be resolved as a binary 1 or 0. As these 1's and 0's stream out of the signal extraction unit 159, they are arranged into codewords in the formatting unit 11.

Since the read path is evaluating sequences of Reed-Solomon codewords previously recorded on the disk 14, then, absent error or erasure, the codewords should be the same. In order to test whether that is the case, each codeword is applied to an ECC read processor 163 over a path from a formatter 161. Also, the output from the ECC processor 163 is written into buffer 165. The read path also operates in a synchronous datastreaming manner such that any detected errors must be located and corrected within the codeword well in time for the ECC read processor 163 to receive the next codeword read from the disk track 42. The buffer 165 and the read and write channels may be monitored and controlled by the microprocessor 125 (FIG. 2) to ensure efficacy where patterns of referencing may dictate that a path not be taken down, such as sequential read referencing.

Having described the general environment in which the ECC system 100 of the present invention operates, an error correction code (ECC) module 200 will first be described in the context of algebraic error correction of binary data, and its main components will then be described with reference to FIG. 4. Each of the ECC read processor 163 and the ECC write processor 167 includes an ECC module 200 which is implemented in hardware using digital logic.

For the purpose of algebraic error correction, the data is represented symbolically in terms of elements in a Galois field. Specifically, as an example, all distinct 8-bit strings are represented as symbols in a Galois field of 256 elements. The ECC system 100 (FIG. 4) includes several functional units such as an encoder 202, a syndrome generator 205, a key equation solver 210 that provides error locator and error evaluator polynomial calculations, and the ECC module 200.

U.S. Pat. No. 5,946,328 to Cox et al., assigned to the same assignee as the present invention, and which is incorporated herein by reference, describes the process of finding the roots of the error locator polynomial. It is thus assumed herein that the coefficients of the error locator polynomial have been calculated and are stored in ECC system 100. An aspect of the present invention is to calculate by means of a logic circuit the roots of this error locator polynomial, i.e., the error values.

While it would be theoretically possible to perform direct calculations by means of formulas that are hardwired in logic, or to alternatively provide an iterative exhaustive search over all possible error locations, the practical considerations of latency and hardware complexity would hinder such an implementation. Up to the sixth degree, direct calculations of the roots in terms of hardwired formulas is less hardware consuming and faster than a parallelized iterative search for the sector sizes used in current hard disk drives (i.e., 512 bytes). However, beyond the sixth degree, the direct solution approach for the roots becomes more hardware intensive than the iterative search, and an iterative parallelized search would be the preferred method as it would require a less complex hardware implementation than the direct solution approach.

As a result, both the direct solution and the iterative parallelized search approaches offer significant hardware complexity and latency. Moreover, in view of the ever increasing data rate as well as the projected higher error rates that force hard disk drive designer to increase the sector size, there is a great need for solutions to the foregoing error locator factorization problem that will permit to locate a large number of errors inside increasingly longer sectors and that will minimize hardware complexity and latency.

Figure 4:
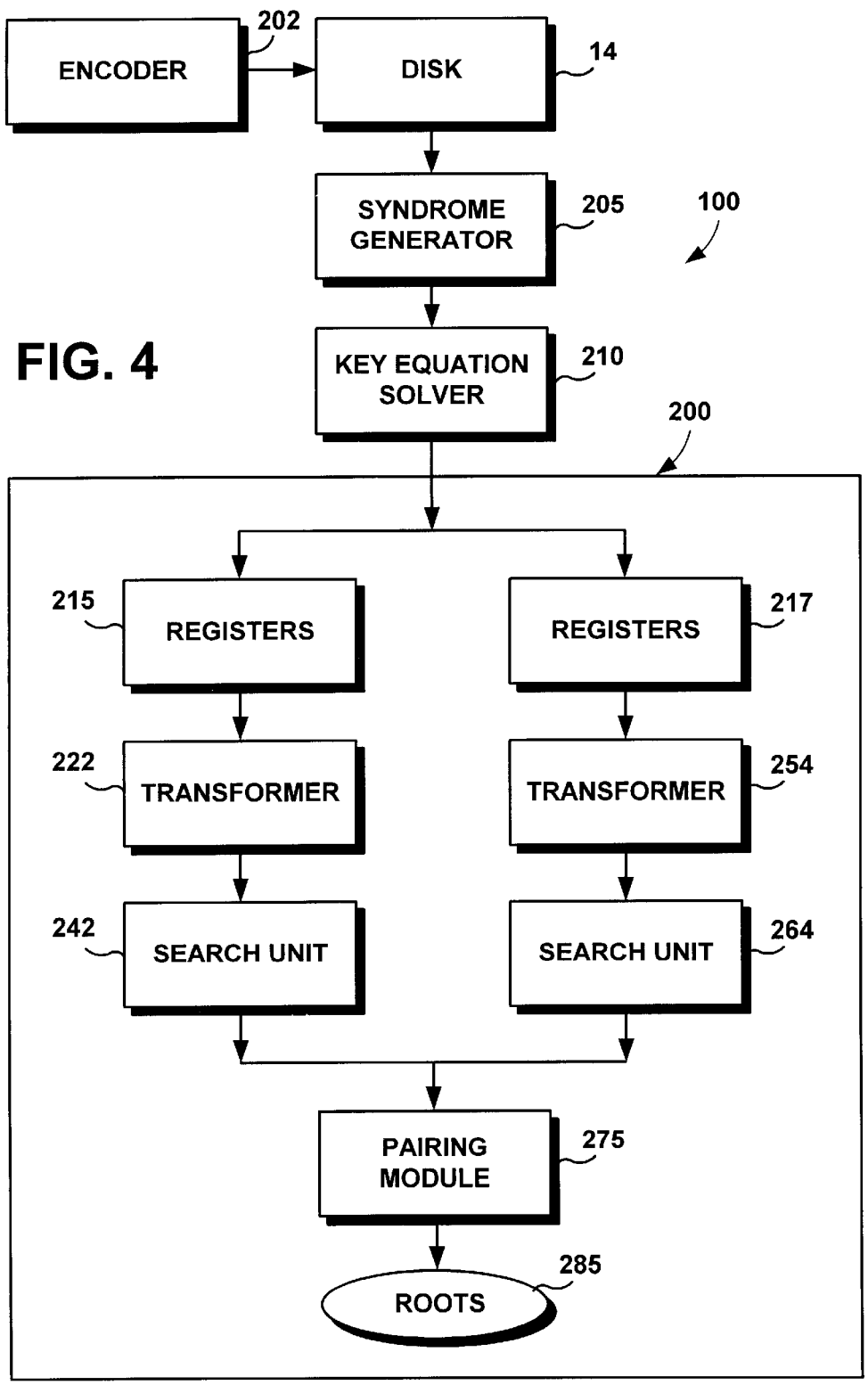
FIG. 4 is a block diagram of the data storage system of FIG. 1, detailing the main components of an error correction code module that forms part of the ECC read processor and the ECC write processor of FIG. 3.

With reference to FIG. 4, an important aspect of the ECC module 200 is the transformation of the error locator polynomial f(x) generated by the key equation solver 210, and whose coefficients are stored in the registers 215 and 217. This transformation is implemented by means of digital hardware logic into two new polynomials, i.e., $f_1(x)$ and $f_2(x)$ whose roots lie in a subfield of the original Galois field. Thus, whereas the original error locations are for example, 8-bit addresses, the transformed error locations are 4-bit addresses.

Generally, if the original polynomial f(x) has roots in a Galois field $GF(2^{2n})$ the roots of the transformed polynomials $f_1(x)$ and $f_2(x)$ are elements in the Galois subfield $GF(2^n)$. In effect, this splitting from the original polynomial f(x) to transformed polynomials $f_1(x)$ and $f_2(x)$ reduces the problem of calculating the roots in the field GF(256) to the problem of calculating the roots in the subfield GF(16) in the example of n=4. The actual operations executed by the ECC module 200, and more specifically by the transformer 222 and the transformer 254 of the ECC module 200, are preferably precomputed by an algorithm and hardwired into digital logic for a given maximum error locator polynomial degree. While the transformers 222 and 254 are illustrated as being separate components, it should be clear that these two transformers 222 and 254 can be functionally combined.

As a result, the actual search for the roots of the polynomials $f_1(x)$ and $f_2(x)$ by the search units 242, 264, respectively, can now be executed in the arithmetic of the subfield $GF(2^n)$ instead of the field $GF(2^{2n})$. While the search units 242 and 264 are illustrated as being separate components, it should be clear that these two search units 242 and 264 can be functionally combined.

Using the present example of a Galois field GF(256), where 2n=8, the search arithmetic can now be implemented with 4-bit arithmetic operations instead of 8-bit arithmetic operations. While the present invention is described herein for illustration purposes only, in terms of a Galois field $GF(2^8)$, it should be clear that in view of the contemplated use of larger records, other Galois field definitions may be used. For example, it is possible to resort to a Galois field $GF(2^{12})$, where 12-bit addresses are used to represent symbols, in which case the present invention permits the search of error locations to be executed over a Galois field $GF(2^6)$, that is over 64 possible locations instead over 4096 possible locations.

Figure 5:
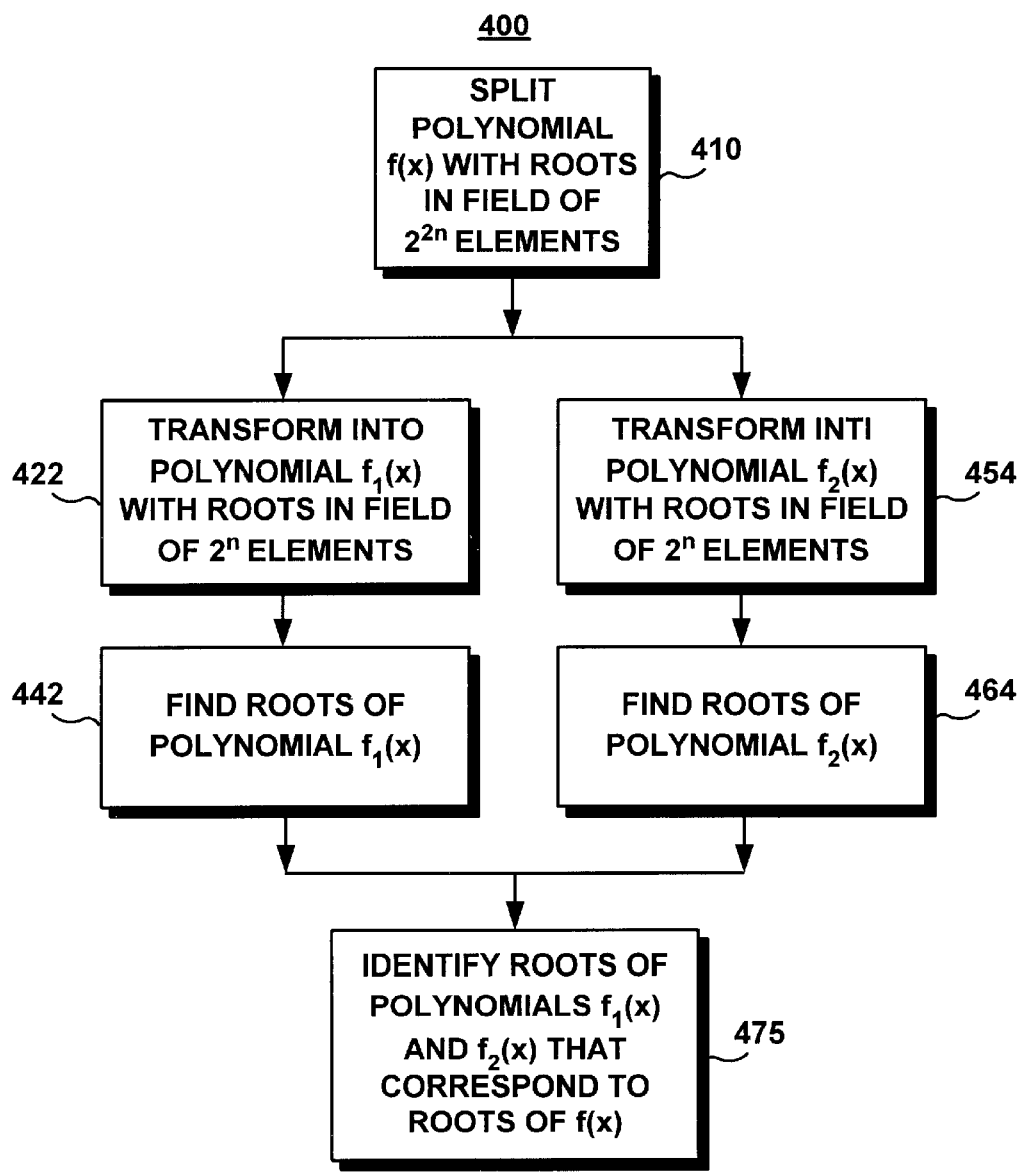
FIG. 5 is a functional flow chart that illustrates the implementation of an error correction code by the error correction code module of FIG. 4.

Referring to FIG. 5, it represents a functional flow chart that illustrates a transformation method 400 for implementing an error correction code by means of the error correction code module 200 of FIG. 4. The theory supporting the method 400 will be now described in general introductory terms.

The method 400 starts at step 410 by splitting a polynomial f(x) over a finite field with $2^{2n}$ elements. The method 400 constructs two polynomials $f_1(x)$ and $f_2(x)$ over a subfield with $2^n$ elements at steps 422 and 454, respectively. The method 400 then locates the roots of the polynomial f(x) over the Galois field $GF(2^{2n})$ by finding the roots of $f_1(x)$ and $f_2(x)$ over the Galois field $GF(2^n)$ at steps 442 and 464, respectively. To complete the transformation process, the method 400 identifies the roots of the polynomials $f_1(x)$ and $f_2(x)$ that correspond to the roots of the polynomial f(x).

Assuming for example that the polynomial f(x) has a degree m then the new method 400 requires at most $(2^{n+1})$ polynomial evaluations of polynomials over the Galois subfield $GF(2^n)$ and $m^2/2$ evaluations of polynomials over the Galois field $GF(2^{2n})$. According to one embodiment of the present invention, the method 400 optimizes the root searching process for a polynomial f(x) whose degree is less than $2^n$.

The following explanation will assist in the understanding of the transformation method 400 of the present invention. The finite Galois field $GF(2^{2n})$ i.e., with an even degree over the Galois subfield GF(2) is constructed by making a quadratic extension to the Galois subfield $GF(2^n)$. Thus, the elements in the field $GF(2^{2n})$ are represented as expressions: "aα+b", where a and b are elements of the subfield $GF(2^n)$ and α satisfies a quadratic equation of the form: "$α^2=α+β$" and β is an element of the subfield $GF(2^n)$, such that $$\sum_{i=0}^{n-1} \beta^{2i} = 1.$$

This implies that the equation for a is irreducible over the subfield $GF(2^n)$ and that "$α^{2^n}=α+1$". The transformation or map Φ: z→$Z^{2^n}$ is the identity map on $GF(2^n)$, but conjugates elements in the field $GF(2^{2n})$. Thus, the map Φ: z→$z^{2^n}$+Z maps any element in the field $GF(2^{2n})$ to an element of the subfield $GF(2^n)$ by mapping the expression "aα+b" to a. Having obtained one of the coefficients of one element, a, it is now possible to obtain the other coefficient, b, by first multiplying the expression: "aα+b" by α, to obtain the following expression:

$$α(aα+b)=aα^2+bα.$$

By substituting "$\alpha^2=\alpha+\beta$", the foregoing expression can be expressed as:

$$\alpha(a\alpha+b)=a\alpha^2+b\alpha=(a+b)\alpha+a\beta.$$

The foregoing expression is then transformed using the map $z \to Z^{2^n}+z$ to obtain a+b.

Figure 6:
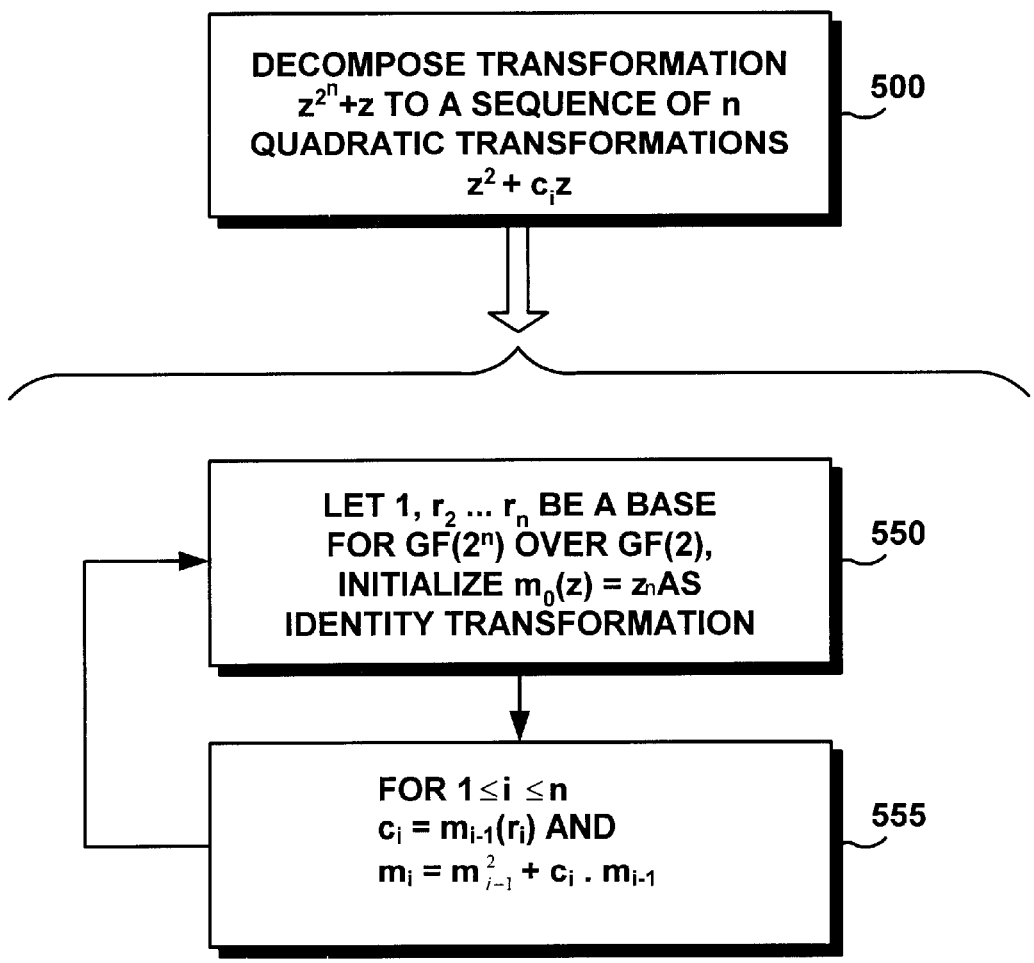
FIG. 6 is a functional flow chart that illustrates a step in the error correction code of FIG. 5, for splitting a polynomial f(x) in a Galois field $GF(2^{2n})$ into two polynomials $f_1(x)$ and $f_2(x)$ and transforming the latter polynomials in a Galois subfield $GF(2^n)$.

With reference to FIGS. 4 through 6, they illustrate a specific and exemplary implementation of the transformation algorithm 422 (FIGS. 5, 6) of splitting a polynomial f(x) in a Galois field $GF(2^{2n})$ into two polynomials $f_1(x)$ and $f_2(x)$ and transforming the latter polynomials in a Galois subfield $GF(2^n)$. The transformation of the polynomial $f_1(x)$ is implemented by the transformer 222 (FIG. 4), and the transformation of the polynomial $f_2(x)$ is implemented by the transformer 254 (FIG. 4).

With a more specific reference to FIGS. 5 and 6, the roots of the polynomial f(x) are expressed in the form: "$a_i\alpha+b_i$", and the polynomial f(x) is transformed to a new polynomial g(y) whose roots are $a_i$. To this effect, and as explained above, the transformation algorithm 422 transforms these roots by the map $z \to Z^{2^n}+z$. This transformation could be implemented by eliminating the variable x from the following equations:

$f(x)=0$, and $X^{2^n}+x=y$, producing a polynomial in y.

One way to accomplish this transformation is to compute the resultant between the polynomials f(x) and the polynomial "$y=X^{2^n}+x$" with respect to x. However, such transformation would be relatively complicated to implement in hardware. As a result, the transformation algorithm 422 decomposes the transformation $z \to Z^{2^n}+z$ to a sequence of n simpler quadratic transformations (block 500).

Referring now to the transformation framework explained earlier, the Galois subfield $GF(2^n)$ is a vector space of dimension n over the subfield GF(2), and thus, the transformation algorithm 422 presumes a basis $r_1$ through $r_n$ where $r_1$ is assumed to be equal to 1 (the unit vector). The transformation algorithm 422 presents an iterative construction of quadratic transformations that compose to yield the transformation $Z^{2^n}+z$. Each quadratic transformation is of the form: $z \to z^2+c_i z$ for some element $c_i$, in the subfield $GF(2^n)$. The transformation algorithm 422 presents a procedure for computing the values of $c_i$.

To this effect, the transformation algorithm 422 starts at block 550 by denoting the composition of the $i^{th}$ quadratic transformations with the designation $m_i(z)$, by initializing $m_0(z)=z$ as the identity transformation, At step 555 of the transformation algorithm 422, and for $1 \leq i \leq n$ we inductively define $c_i$ and $m_i$ using the following equations:

$c_i=m_{i-1}(r_i)$, and $m_i=m_{i-1}^2+c_i \cdot m_{i-1}$ for $1 \leq i \leq n$.

When i=n, we have $m_n(z)=Z^{2^n}+z$. This allows the transformation algorithm 422 to decompose the map $z \to Z^{2^n}+z$ to the sequence of quadratic maps $z \to z^2+c_i z$, by composing these quadratic maps n times at block 655. The composition of these quadratic maps does not commute; rather, they need to be applied in the order in which they were computed.

In the special case where n is also a power of 2, i.e., $n=2^k$, all the elements $c_i$ are set equal to 1, and the map $z \to z^2+z$ is composed n times. In particular this holds true when the original field is the Galois field $GF(256)=GF(2^{2n})$, where n=4 and the map $z \to z^{16}+z$ is just the map $z \to z^2+z$ composed 4 times.

Figure 7:
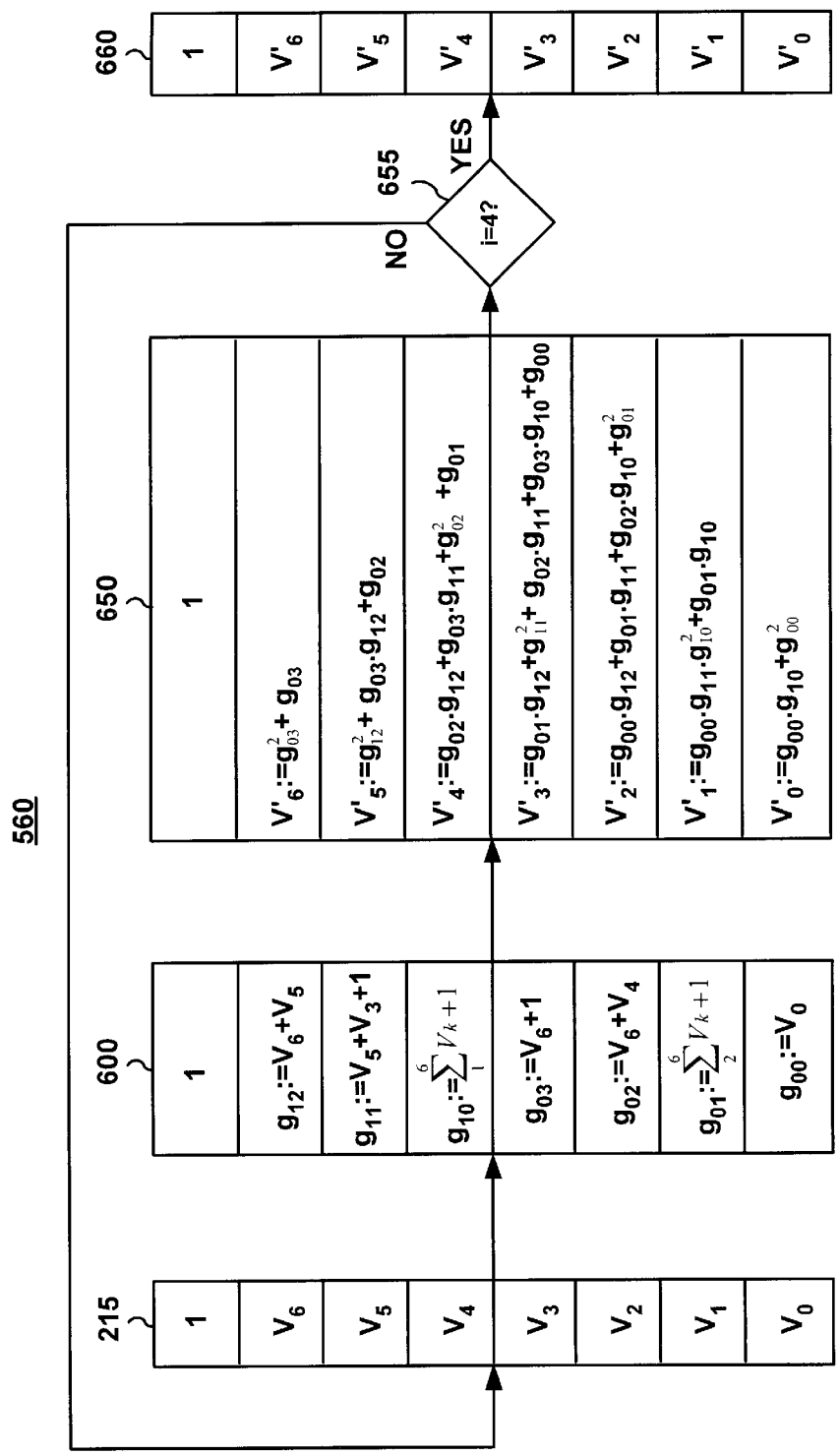
FIG. 7 illustrates the process of transforming the roots of the polynomial $f(x)$ by a set of quadratic transformations and the resulting polynomial $f_1(x)$.

FIG. 7 illustrates the process 422 (FIG. 5) of transforming the roots of the polynomial f(x) by a set of quadratic transformation (step 560), as implemented by means of the transformer 222 (FIG. 4), and the step 442 (FIG. 5) of finding the roots of the resulting polynomial $f_1(x)$ by means of a search unit 242 (FIG. 4). In this example, the polynomial f(x) has a degree m and is denoted as V(x), i.e., f(x)=V(x), where:

$$V(x) = x^m + \sum_{k=1}^{m} V_{m-k} \cdot x^{m-k} \to V'(x) = x^m + \sum_{k=1}^{m} V'_{m-k} \cdot x^{m-k}.$$

For a more specific example where m=7, the above transformation is expressed as follows:

$$V(x) = x^7 + \sum_{k=1}^{7} V_{7-k} \cdot x^{7-k} \to V'(x) = x^7 + \sum_{k=1}^{7} V'_{7-k} \cdot x^{7-k},$$

$$x_k: V(x_k) = 0 \to x'_k: x_k^{16}+x_k: V'(x'_k)=0, \text{ and}$$

wherein $V'(x)=f_1(x)$ is the transformed polynomial.

The process 560 starts by eliminating x from the following equations:

$f(x)=0$, and $x^2+cx=y$, where c is left as an indeterminate to represent any particular value of $c_i$. The remainder 600 is computed after dividing f(x) by $(X^2+cx+y)$. The remainder 600 is expressed as follows:

$g_1(y)x+g_0(y)$.

In the example described herein the polynomials $g_1(y)$ and $g_0(y)$ are written as follows:

$g_1(y)=y^3+g_{12} \cdot y^2+g_{11} \cdot y+g_{10}$, and $g_0(y)=g_{03} \cdot y^3+g_{02} \cdot y^2+g_{01} \cdot y+g_{00}$.

Substituting $x=g_0(y)/g_1(y)$ into $x^2+cx+y$, and clearing the denominators, yields the following polynomial 650:

$g(y)=g_0(y)+cg_1(y))+yg_1(y)^2$ whose roots are exactly the roots of f(x) transformed by the quadratic map $x^2+cx$.

Treating g(x) as the new polynomial, the next quadratic transformation is performed at step 655 for n iterations (in this example, n=4). The n transformations of the form $(x^2+c_i x)$, yield a final polynomial $f_1(x)=g(y)$ whose roots have been transformed by $(x^{2^n}+x)$ and stored in registers 660. The roots of this polynomial g(y) provide the coefficients $a_i$ associated with each root of the original polynomial f(x). All the roots (and coefficients after dividing through by the leading coefficient) of the polynomial g(y) lie in the Galois subfield $GF(2^n)$, which permits the use of less expensive hardware to locate the roots over this subfield.

FIG. 7 illustrates the actual expressions of $g_{12}$, $g_{11}$, $g_{10}$, $g_{03}$, $g_{02}$, $g_{01}$, and $g_{00}$ in terms of the coefficients of the polynomial f(x): $V_0$, $V_1$, $V_2$, $V_3$, $V_4$, $V_5$ and $V_6$, as well as expressions for the coefficients of the transformed polynomial: $V_0$, $V'_1$, $V'_2$, $V'_3$, $V'_4$, $V'_5$ and $V'_6$.

Figure 8:
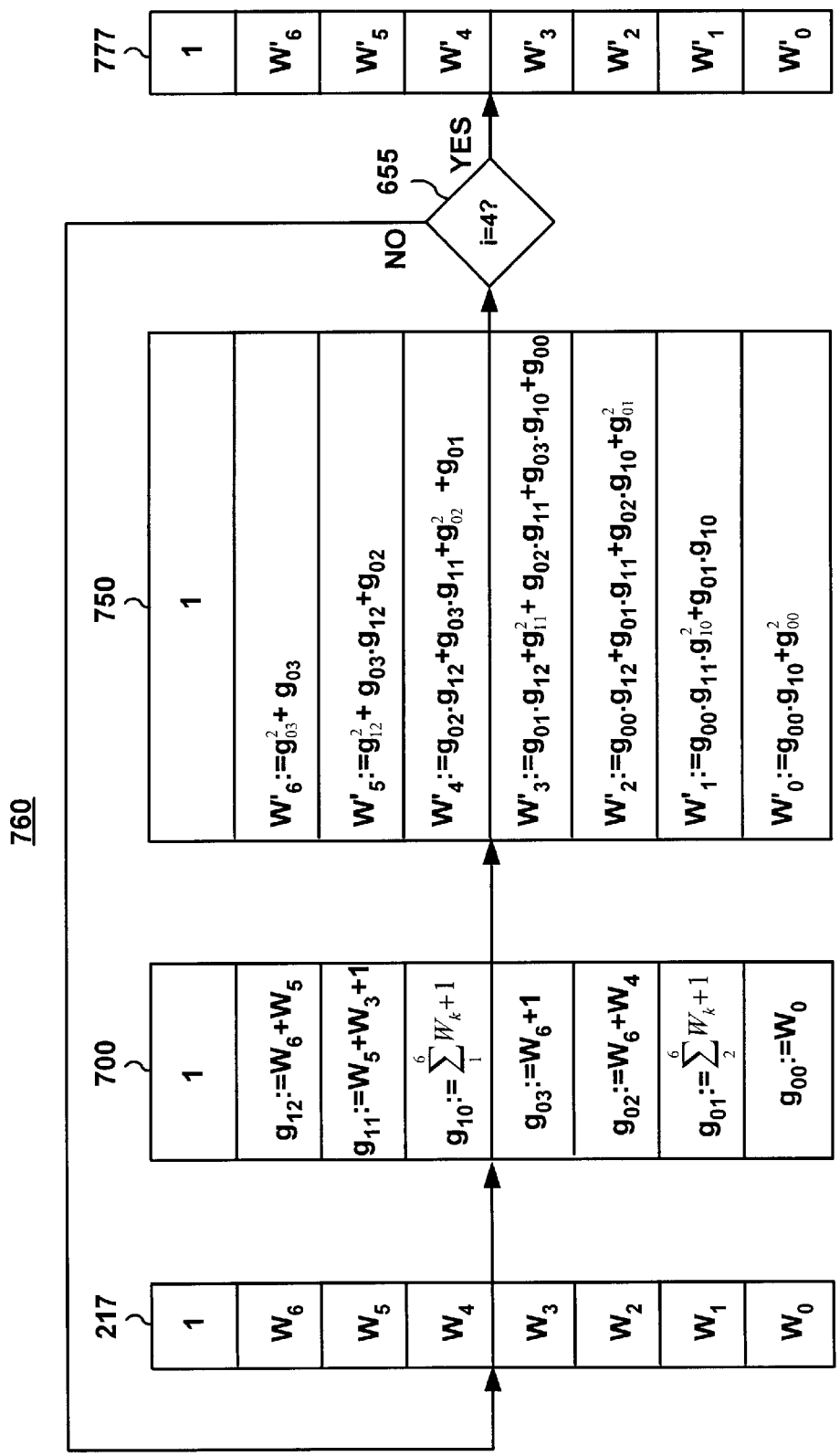
FIG. 8 illustrates the process of transforming the roots of the polynomial $f(x)$ by a set of quadratic transformations, and the resulting polynomial $f_2(x)$.

FIG. 8 illustrates the process 454 (FIG. 5) of transforming the roots of the polynomial f(x) by a set of quadratic transformation (step 760), as implemented by means of the transformer 254 (FIG. 4), and the step 464 (FIG. 5) of finding the roots of the resulting polynomial $f_2(x)$ by means of a search unit 264 (FIG. 4). The process 760 is preferably implemented in an identical sequence and manner as described above in connection with the process 560 (FIG. 7).

The process 760 computes the polynomial $f(x/\alpha)$ 700 whose roots are of the form $[\alpha(a_i\alpha+b_i)=(a_i+b_i)\alpha+a_i\beta]$. Applying the same sequence of quadratic transformations 750 to this new polynomial 700, yields a polynomial $f_2(x)$ whose roots $a_i+b_i$ and stored in registers 777. This polynomial 777 has its coefficients and roots in the Galois subfield $GF(2^n)$. The roots of this polynomial $f_2(x)$ are located by the search unit 264 (FIG. 4) as described herein.

Referring back to FIG. 4, and assuming the original polynomial $f(x)$ has a degree m, the on-the-fly error correction code system 100 has computed two sequences of values in the Galois subfield $GF(2^n)$, $a_i$ and $(a_i+b_i)$ for $1 \leq i \leq m$. A pairing module 275 needs to test all the pairs of values from the appropriate sequences. For each value $a_i$ from the first sequence and $(a_j+b_j)$ from the second sequence, the error correction code system 100 computes the candidate root: $[a_i\alpha+a_i+(a_j+b_j)]$, and tests whether or not this is a root of the original polynomial $f(x)$. After a root is found, it is removed from the corresponding pair from the two sequences, and the testing of the remaining pairs continues. After at most $m^2/2$ polynomial evaluations, all the roots of the polynomial $f(x)$ would be found.

When the transformation is implemented in a fixed, finite Galois field $CF(2^{2n})$, e.g. GF(256), the elements $\alpha$ and $\beta$ and the coefficients $c_i$ can be precomputed for the corresponding quadratic transformations. When the roots for a polynomial of a fixed degree m are being located, it is possible to precompute the coefficients of the polynomials $g_0(y)$ and $g_1(y)$ used to build the transformed polynomial 650: $g(y)=g_0(y)(g_0(y)+cg_1(y))+yg_1(y)^2$ resulting from the application of the quadratic transformation $x^2+cx$.

Thus, the work required at run time is to transform the original polynomial by the quadratic transformations $(x^2+c_ix)$ for $1 \leq i \leq n$ using the precomputed values of $c_i$ and the formulas precomputed for the polynomials $g_0(y)$ and $g_1(y)$ in terms of the coefficients of a generic polynomial $f(x)$. Then, the roots of this transformed polynomial are located in the Galois subfield $GF(2^n)$ that requires $2^n$ polynomial evaluations, yielding the sequence $a_i$ for $1 \leq i > m = \text{degree}(f)$. The original polynomial is also scaled to $f(x/\alpha)$, its transform computed, and its roots located, requiring an additional $2^n$ polynomial evaluations over the Galois subfield $GF(2^n)$. As a last step in this transformation process, the elements in the two sequences are matched (or paired), providing at most $m^2/2$ candidate roots to be tested against the original polynomial $f(x)$.

It is to be understood that the specific embodiments of the invention that have been described are merely illustrative of certain application of the principle of the present invention. Numerous modifications may be made to the error correcting system and associated method described herein, without departing from the spirit and scope of the present invention. Moreover, while the present invention is described for illustration purpose only in relation to a data storage system, it should be clear that the invention is applicable as well to various communications and data processing systems.

What is claimed is:

1. A method for reducing data error location search, comprising:

splitting an error locator polynomial $f(x)$ into two transformed polynomials $f_1(x)$ and $f_2(x)$;

wherein the error locator polynomial $f(x)$ having roots that are elements in a field;

wherein each of the two transformed polynomials $f_1(x)$ and $f_2(x)$ having roots that are elements in a subfield of the field;

searching for the roots of the transformed polynomials $f_1(x)$ and $f_2(x)$ in the subfield;

pairing the roots of the two transformed polynomials $f_1(x)$ and $f_2(x)$; and identifying paired roots of the two transformed polynomials $f_1(x)$ and $f_2(x)$ that correspond to the roots of the error locator polynomial $f(x)$.

2. The method of claim 1, wherein the error locator polynomial $f(x)$ is over a finite field of $(2^{2n})$ elements; and wherein splitting the error locator polynomial $f(x)$ includes generating two transformed polynomials $f_1(x)$ and $f_2(x)$ over a finite subfield of $(2^n)$ elements.

3. The method of claim 2, wherein the error locator polynomial $f(x)$ is over a Galois field of $GF(2^{2n})$ elements; and wherein splitting the error locator polynomial $f(x)$ includes generating two transformed polynomials $f_1(x)$ and $f_2(x)$ over a finite Galois subfield of $GF(2^n)$ elements.

4. The method of claim 3, wherein identifying the paired roots includes performing a maximum of $(2^{n+1})$ evaluations of the transformed polynomials $f_1(x)$ and $f_2(x)$ over the Galois subfield $GF(2^n)$.

5. The method of claim 4, wherein the error locator polynomial $f(x)$ has a degree m; and wherein identifying the paired roots includes performing a maximum of $m^2/2$ evaluations of the transformed polynomials $f_1(x)$ and $f_2(x)$ over the Galois field $GF(2^{2n})$.

6. The method of claim 5, further including setting n=4.

7. The method of claim 5, further including setting m=7.

8. The method of claim 2, further including expressing the roots of the error locator polynomial $f(x)$ as: "$a_i\alpha+b_i$"; and transforming the error locator polynomial $f(x)$ to a new polynomial $g(y)$ having roots: $a_i$.

9. The method of claim 8, wherein transforming the error locator polynomial $f(x)$ includes transforming the roots of the error locator polynomial $f(x)$ by a map $z \to z^{2^n}+z$, and eliminating x from the following equations:

$$f(x)=0, \text{ and}$$

$$x^{2^n}+x=y,$$

producing a polynomial in y.

10. The method of claim 9, wherein splitting the error locator polynomial includes transforming the roots of the error locator polynomial $f(x)$ by a set of quadratic transformation into the transformed polynomial $f_1(x)$; and
   finding the roots of the transformed polynomial $f_1(x)$.

11. The method of claim 10, wherein the error locator polynomial $f(x)$ has a degree m; and further including representing the error locator polynomial $f(x)$ as $V(x)$ and the transformed polynomial $f_1(x)$ as $V'(x)$, and representing a transformation map as follows:

$$V(x) = x^m + \sum_{k=1}^{m} V_{m-k} \cdot x^{m-k} \to V'(x) = x^m + \sum_{k=1}^{m} V'_{m-k} \cdot x^{m-k},$$

$$x_k: V(x_k) = 0 \to x'_k: x_k^{2^n} + x_k: V'(x'_k) = 0.$$

12. The method of claim 11, further including decomposing the map $z \to z^{2^n}+z$ to a set of precomputed quadratic transformations.

13. An error correction code module for reducing data error location search, comprising:

a transformer for splitting an error locator polynomial $f(x)$ into two transformed polynomials $f_1(x)$ and $f_2(x)$;

wherein the error locator polynomial $f(x)$ having roots that are elements in a field;

wherein each of the two transformed polynomials $f_1(x)$ and $f_2(x)$ having roots that are elements in a subfield of the field;

a search unit for searching for the roots of the transformed polynomials $f_1(x)$ and $f_2(x)$ in the subfield;

a pairing module for pairing the roots of the two transformed polynomials $f_1(x)$ and $f_2(x)$ and identifying paired roots of the two transformed polynomials $f_1(x)$ and $f_2(x)$ that correspond to the roots of the error locator polynomial $f(x)$.

14. The error correction code module of claim 13, wherein the error locator polynomial $f(x)$ is over a finite field of $(2^{2n})$ elements; and wherein the two transformed polynomials $f_1(x)$ and $f_2(x)$ are over a finite subfield of $(2^n)$ elements.

15. The error correction code module of claim 14, wherein the error locator polynomial $f(x)$ is over a Galois field of $GF(2^{2n})$ elements; and wherein the two transformed polynomials $f_1(x)$ and $f_2(x)$ are over a finite Galois subfield of $GF(2^n)$ elements.

16. The error correction code module of claim 15, wherein the pairing module performs a maximum of $(2^{n+1})$ evaluations of the transformed polynomials $f_1(x)$ and $f_2(x)$ over the Galois subfield $GF(2^n)$.

17. The error correction code module of claim 16, wherein the error locator polynomial $f(x)$ has a degree m; and wherein the pairing module performs a maximum of $m^2$ evaluations of the transformed polynomials $f_1(x)$ and $f_2(x)$ over the Galois field $GF(2^{2n})$.

18. The error correction code module of claim 17, wherein n=4.

19. The error correction code module of claim 18, wherein m=7.

20. The error correction code module of claim 14, wherein the transformer transforms the roots of the error locator polynomial $f(x)$ by a set of quadratic transformation into the transformed polynomial $f_1(x)$; and the search unit finds the roots of the transformed polynomial $f_1(x)$.

21. The error correction code module of claim 20, wherein the error locator polynomial $f(x)$ has a degree m; and wherein the error locator polynomial $f(x)$ is represented as $V(x)$ and the transformed polynomial $f_1(x)$ is represented as $V'(x)$, and a transformation map is represented as follows:

$$V(x) = x^m + \sum_{k=1}^{m} V_{m-k} \cdot x^{m-k} \rightarrow V'(x) = x^m + \sum_{k=1}^{m} V'_{m-k} \cdot x^{m-k},$$

$$x_k: V(x_k) = 0 \rightarrow x'_k: x_k^{2^n} + x_k: V'(x'_k) = 0).$$

22. The error correction code module of claim 21, wherein the transformer composes the set of quadratic transformation n times.

* * * * *